United States Patent [19]

Daikuzono

[11] Patent Number: 5,272,310
[45] Date of Patent: Dec. 21, 1993

[54] SOLDERING METHOD
[75] Inventor: Norio Daikuzono, Chiba, Japan
[73] Assignee: S.L.T. Japan Co., Ltd., Tokyo, Japan
[21] Appl. No.: 852,050
[22] Filed: Mar. 16, 1992
[30] Foreign Application Priority Data
  Jan. 17, 1992 [WO] PCT Int'l Appl. ... PCT/JP92/00032
[51] Int. Cl.⁵ .............................................. B23K 26/00
[52] U.S. Cl. .............................. 219/121.64; 219/85.13
[58] Field of Search ..................... 219/121.63, 121.61, 219/85.1, 85.12, 85.13

[56] References Cited

U.S. PATENT DOCUMENTS

| | | | |
|---|---|---|---|
| 3,304,403 | 2/1967 | Harper | 219/121.63 |
| 3,463,898 | 8/1969 | Takeoka et al. | 219/121.63 |
| 4,893,742 | 1/1990 | Bullock | 219/121.63 X |
| 4,970,365 | 11/1990 | Chalco | 219/121.63 |

FOREIGN PATENT DOCUMENTS 58-173093 10/1983 Japan .
63-50867 4/1988 Japan .
2-213075 8/1990 Japan .

Primary Examiner—C. L. Albritton
Attorney, Agent, or Firm—Lowe, Price, LeBlanc & Becker

[57] ABSTRACT

The present invention relates to a method of soldering electronic components to each other. When a member to be bonded is soldered to a base material by irradiating the member to be bonded with laser lights, the laser lights are incident upon a laser light transmittable probe and are emitted from the front end of the probe and the front end of the probe is in substantial contact with a solder or the member to be bonded.

20 Claims, 14 Drawing Sheets

FIG. 9(A)  FIG. 9(B)  FIG. 9(C)
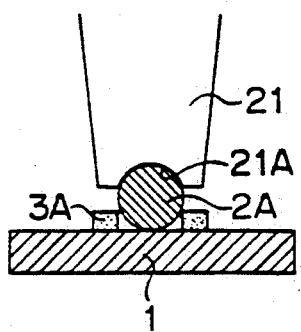 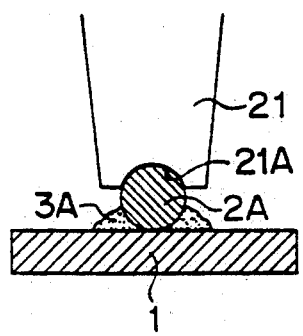 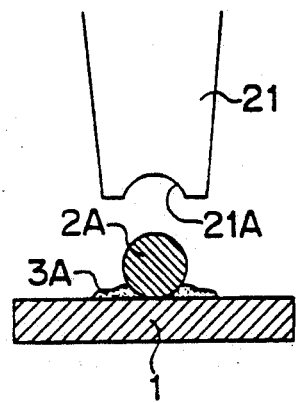
FIG. 10  FIG. 11
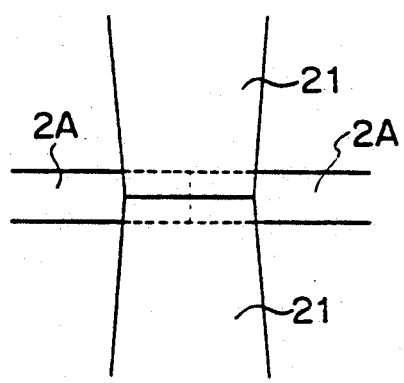 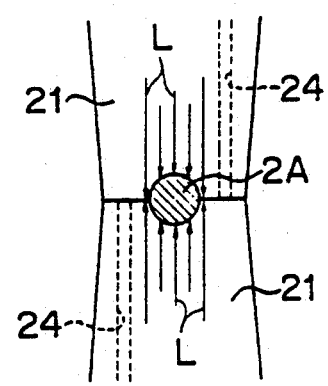

FIG. 23(A)     FIG. 23(B)     FIG. 23(C)
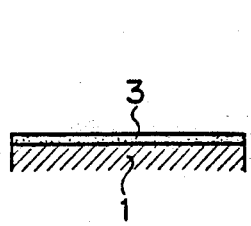 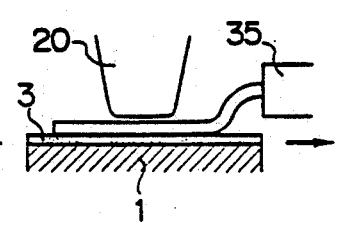 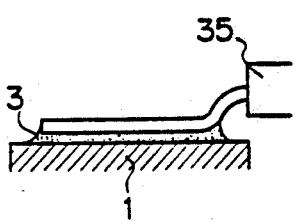
FIG. 24(A)     FIG. 24(B)     FIG. 24(C)
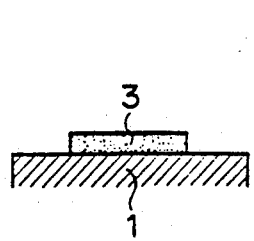 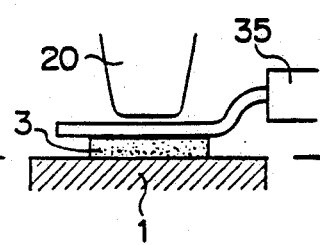 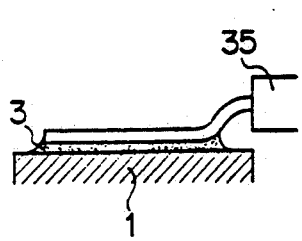
FIG. 25(A)     FIG. 25(B)     FIG. 25(C)
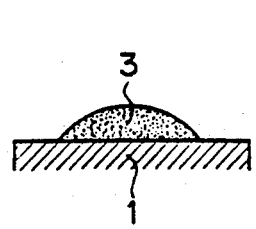 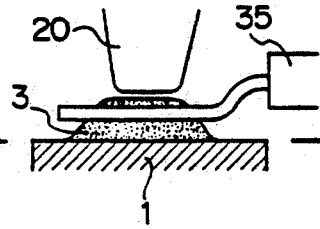 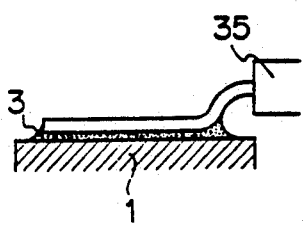

SOLDERING METHOD

FIELD OF THE INVENTION

The present invention relates to a method of soldering electronic components, etc.

BACKGROUND OF THE PRIOR ART

With an recent advances in the electronic industry, connection of conductors, and mounting of capacitors and IC chips has become more important.

Soldering (or brazing) has heretofore been used in the field of electronic industry. In order to perform bonding in a good manner, flow soldering methods such as dipping method, in-liquid dipping method, ultrasonic dipping method and reflow soldering methods such as infrared method, heated air blowing method, electric resistor method, ultrasonic method, laser method and high frequency induction method have been recently used as well as copper soldering method.

Since laser soldering is capable of condensing laser lights in a fine spot in this case, it has advantage in that it can preferably cope with the miniaturization of electronic devices and elements and the output can be easily electrically or optically controlled. There is also an advantage that no inclusion of an impurity in the solder occurs since the laser method is a non-contact method for the solder.

In accordance with the non-contact laser method, a formed solder 3 is irradiated with laser lights L on the surface thereof when a member 2 to be bonded, for example, a conductor is soldered to a base material 1 with the formed solder 3.

Since the reflection factor of the surface of the solder 3 for the laser lights is high, the absorption factor for the laser lights is low. Therefore, it is necessary to emit laser lights at a high power. This invites an increase in the scale of a power source for a laser light generator, etc.

Elevation in temperature of a member 2 to be bonded is mainly due to thermal conduction from the solder 3. Accordingly, the speed of the temperature elevation is low, resulting in an decrease in soldering speed.

The laser lights abruptly decrease their energy after they are emitted into air from an emitting position. Most of the energy will be lost by reaching an irradiation position.

Although the laser lights have a high converging ability, they have a diverging ability to some extent. Accordingly, they will heat a member, for example, a portion of the base material, which is not desired to be heated as shown in FIGS. 27 and 28 so that it may be thermally damaged.

It is therefore a main object of the present invention to provide a soldering method which is capable of sufficiently performing a soldering at a low output and positively heating only an object in a position where it is desired to be heated.

DISCLOSURE OF THE INVENTION

The present invention provides a method of soldering a member to be bonded to a base material by irradiating the member to be bonded with laser lights, comprising: directing said laser lights so that they are incident upon a laser light transmitting probe; emitting the laser lights from the front end of the probe and substantially contacting said front end of the probe with a solder or the member to be bonded.

Since this causes the probe to substantially contact with the solder or the member to be bonded, there is no energy loss of the laser lights due to radiation to air. The laser lights are incident upon the solder or the member to be bonded. As a result of this, soldering can be performed although the laser lights are low outputs. If the laser lights are reflected on the surface of the solder or the member to be bonded, the reflected lights has reflected on the surface of the probe so that they are incident upon the solder or the member to be bonded again. The loss of the lights due to reflections is thus low.

The spot of the laser lights can be restricted by presetting the configuration and the emitting position of the probe. This makes it possible to heat only the solder or the member to be bonded. Accordingly, the base material is prevented from being thermally damaged.

In an aspect of the present invention, the probe may be formed at the front end thereof with a recess which is substantially identical with the contact surface of the solder so that said front end of the probe is in surface contact with the solder. This enables the laser lights to be efficiently incident upon the solder or the member to be bonded.

The probe may be formed with a layer having laser light scattering means or means for converting some of the laser lights into infrared rays which are easily absorbed by a material forming the object to be irradiated, at the front end of the probe in the contact position. In this case, visible lights may be emitted as well as infrared light.

If the probe has the laser light scattering means, irradiation of the surface of the solder or the member to be bonded with the laser lights in all directions becomes possible unlike the straight irradiation in the same direction performed in the prior art non-contact method. Even if the irradiation is performed while the probe is close to the object, the degree of the reflection becomes low, resulting in a high efficiency of irradiation. If infrared-ray converting means, for example, infrared radiating particles are included in the layer, the laser lights are absorbed by the infrared ray radiating particles and are converted into infrared rays. Since the solder or the member to be bonded is irradiated with the converted infrared rays and unabsorbed laser lights, soldering at a low power which is lower than that in case of only irradiation with laser lights is possible.

The probe may be formed with a cooling medium passage for supplying a cooling medium, which extends through the probe to said contact position. The quantity of the laser lights which return from the incident surface of the probe is detected and the quantity of incident laser lights may be controlled as an index of temperature at the irradiation position. A temperature probe may be disposed in the probe so that it extends through the probe and contacts with or is close to the solder and the energy of the emitted laser lights is controlled based upon a temperature signal from the temperature probe for achieving an appropriate soldering control.

BRIEF DESCRIPTION OF THE DRAWINGS

FIGS. 9(A), 9(B) and 9(C) are schematic views showing examples in which the arrangements of the solder are different in order of steps;

FIG. 10 is a front view showing connecting conductors with each other;

FIG. 11 is a cross-sectional view of FIG. 10;

FIGS. 23 to 25 are views showing manners of soldering by the reflow method;

BEST MODE FOR EMBODYING THE PRESENT INVENTION

Figure 1:
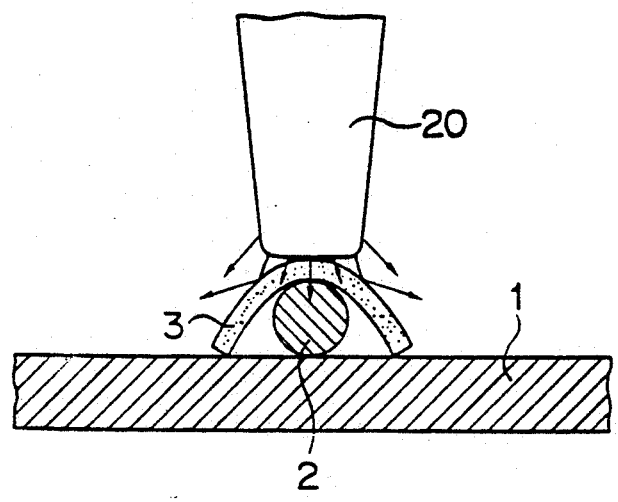
FIG. 1 is a sectional view showing an initial phase of soldering in a first embodiment.
Figure 2:
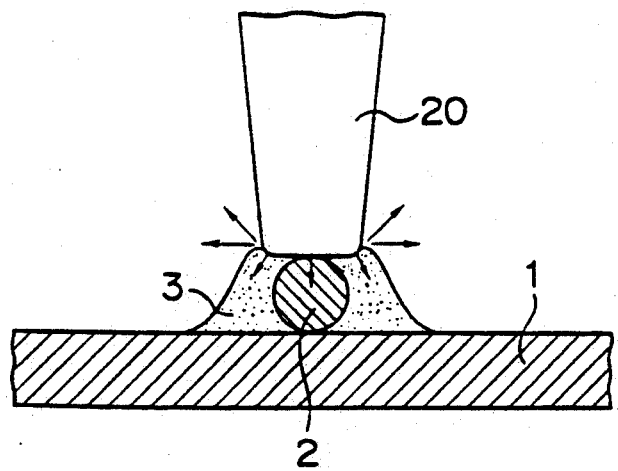
FIG. 2 is a sectional view showing the molten state of a solder.

The present invention will be described by way of embodiments with reference to drawings.

FIGS. 1 to 3 and 12 show a first embodiment of the present invention.

Laser lights from a laser light generator 12 which is driven by a power supply 11 are transmitted through a temperature detecting half mirror 13 and a condensing lens 14 and are incident upon the rear end of an optical fiber 15 and are emitted from the front end of the optical fiber 15. A contact probe 20 of the present invention is disposed in front of the front end of the optical fiber 15. A contact probe 20 of the present invention is disposed in front of the front end of the optical fiber 15. The laser lights are incident upon the rear end of the contact probe 20.

On the other hand, a member 2 to be bonded is preliminarily placed upon a base material 1 such as a metal base. A solder material, such as a formed solder 3 covers the member 2 to be bonded. On soldering, the probe 20 is lowered so that the front end thereof is brought into contact with the shaped solder 3 and laser lights are emitted from the front end of the probe 20. Although a part of the laser lights are reflected on the surface of the formed solder 3, most of the laser lights are incident upon the formed solder and then used to apply the melting energy therefor. In association with melting, the solder 3 exhibits a flow state depending upon the surface tension which is intrinsic to its material. Although the probe 20 may be fixed in the original contact position at this time, the probe may be lowered as the flow progresses for increasing the area of contact between the solder and the probe. After completion of melting of the solder 3, the probe 20 is elevated to separate from the solder to wait for next conveyed material to be soldered.

Figure 3:
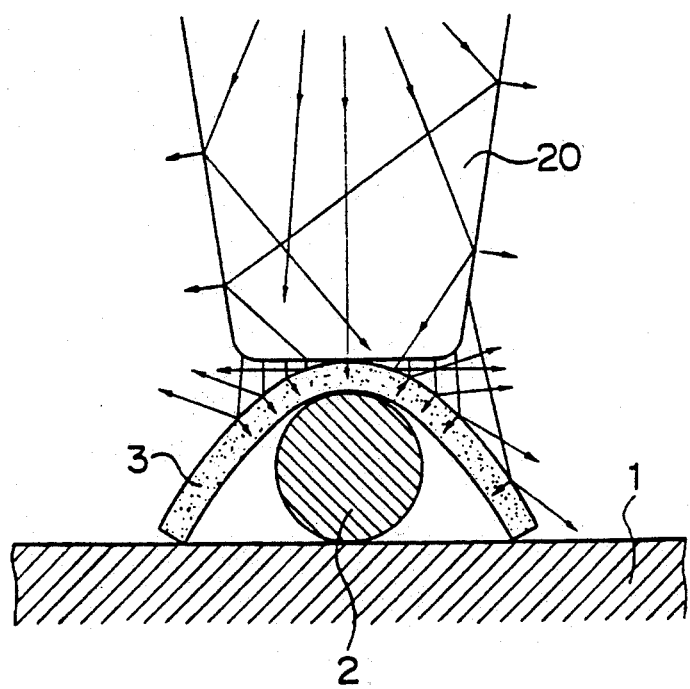
FIG. 3 is an enlarged view of FIG. 1.
Figure 27:
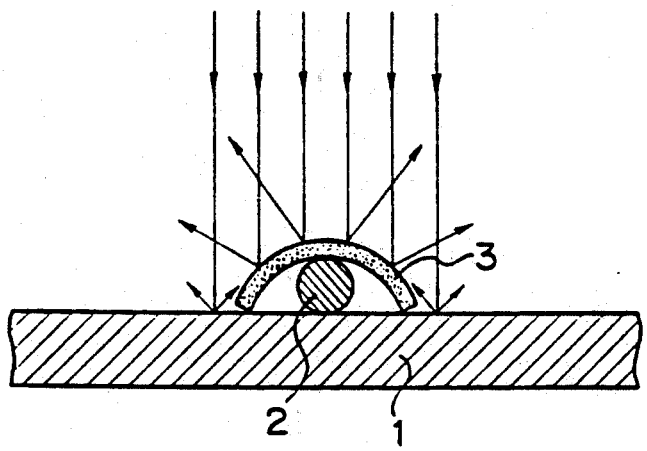
FIG. 27 is a schematic view showing a soldering method using a prior art laser light irradiation.
Figure 28:
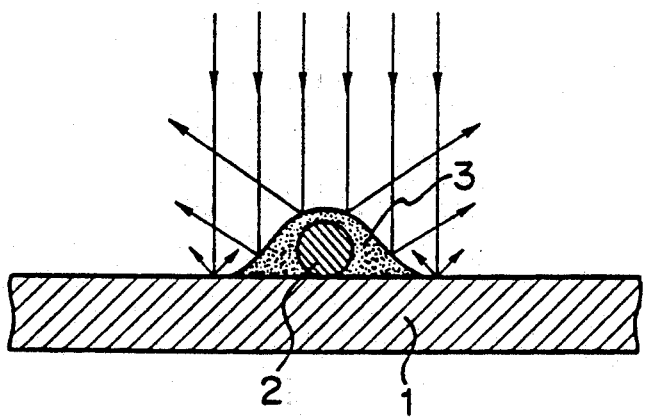
FIG. 28 is a schematic view showing the molten state of the solder.

In accordance with the present invention, the laser lights are not transmitted through air for irradiating an object, but are emitted through the probe 20. When the laser lights are incident upon the probe 20, some of the laser lights are transmitted through the surface of the probe 20 depending upon the shape of the probe 20. The other laser lights are directed toward the front end thereof. Accordingly, these laser lights are emitted in various directions as shown in FIG. 3 in detail. As a result of this, the surface of the solder 3 is irradiated with laser lights in various directions, not by straight forwardly directing laser lights as is done in a prior art. Therefore, the quantity of the laser lights incident upon the surface of the solder 3 along the normal line become larger in comparison with the prior art although some of the incident laser lights are reflected upon the surface of the solder 3 in the present invention as is readily anticipated from the simulated comparison of FIG. 3 with FIG. 27. As a whole, the quantity of the reflected laser lights becomes less, resulting in that efficient irradiation can be achieved.

Figure 4:
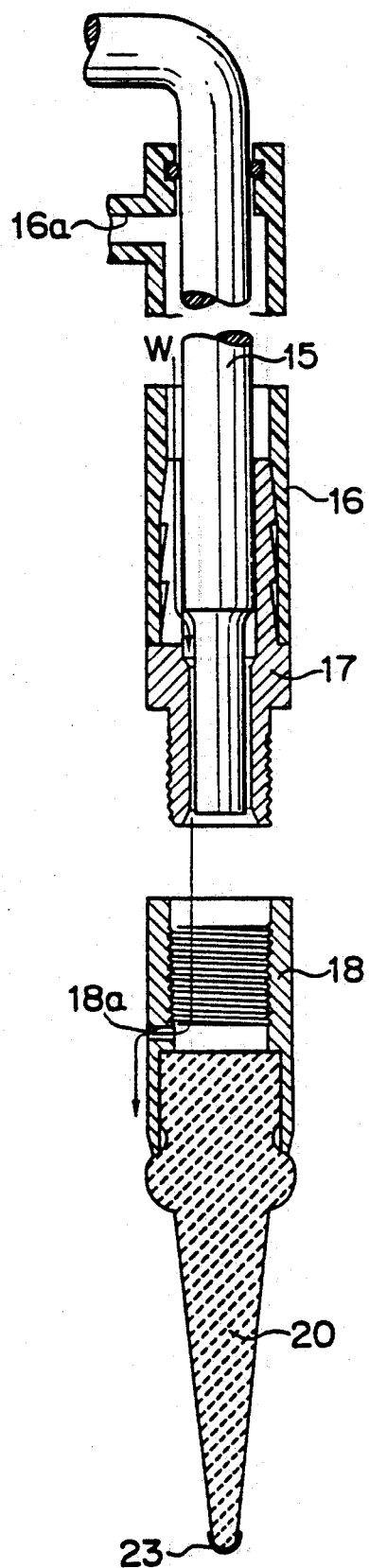
FIG. 4 is a longitudinal cross-sectional view showing a holding structure of a probe.

FIG. 4 shows a structure for coupling the optical fiber 15 to the probe 20. The optical fiber 15 is held in a holder 16. A male connector 17 provided at the front end of the holder 16 is threadably engaged with a female connector 18. The probe 20 is secured to the front end of the female connector 18 by caulking, etc. The rear end portion of the probe 20 may be cooled by providing a small spacing between the holder 16, the connectors 17 and 18 and the optical fiber 15 and supplying the spacing with air or cooling water W from a water supply inlet 16a. This cooling is not generally necessary since the output of the laser lights may be low. The cooling water W which has been supplied for cooling is discharged outside from the water discharge outlet 18a.

Although the material of the probe of the present invention is not limited if it has a transmittance for laser lights and a heat resistance, light transmittable and heat resisting plastics may be used as well as inorganic materials such as diamond, sapphire, quartz, monocrystal zirconium oxide, high melting point glass whether or not it is artificial or natural.

Preferably, laser lights are scattered from the front end of the probe or infrared rays are emitted after the laser lights have been converted into infrared rays. The probe 20 may be machined to provide a rough (frosted) surface 20a as shown in FIG. 6 for scattering the laser lights.

Figure 6:
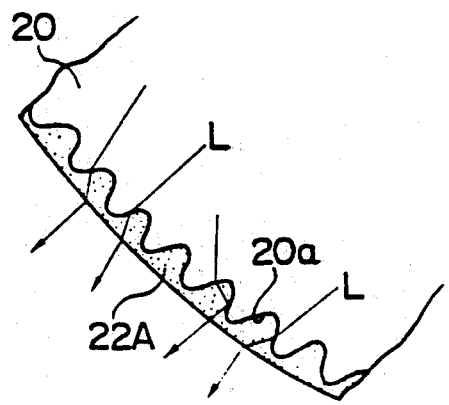
FIG. 6 is a sectional view showing a main part of a probe which is formed with concave and convex portions.

Alternatively, a layer containing laser scattering powders 22A may be formed on a smooth surface or the roughed surface 20a as shown in FIG. 6. In this case, the laser light scattering powders may be selected from materials having a laser light refraction index higher than that of the above-mentioned materials of the probe 20 or the above-mentioned exemplary materials. The materials may be formed into a layer containing the laser light scattering material as a binder by means such as applicating.

Figure 7:
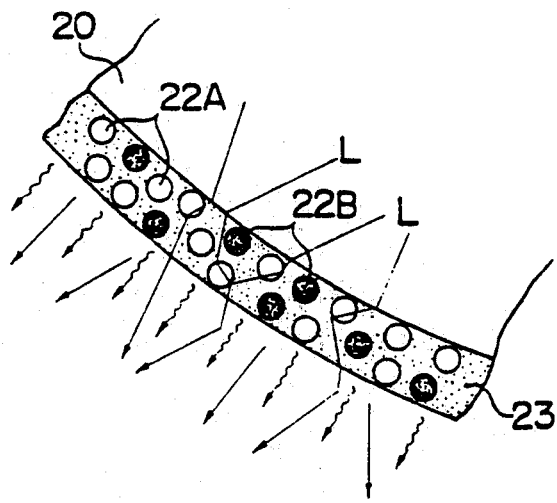
FIG. 7 is a sectional view showing a main part of a probe having a layer provided with laser light scattering means and thermal ray emitting means.

More preferably, a probe in which some of the laser lights are converted into infrared rays and emitted therefrom is used. Infrared converting powder 22B of a material such as carbon, graphite, iron oxide and manganese oxide may be used as infrared converting means as shown in FIG. 7. The infrared converting powders 22B may be applied upon the surface of the probe 20. Alternatively, they may be applied on the roughed surface 20a as shown in FIG. 8.

Figure 8:
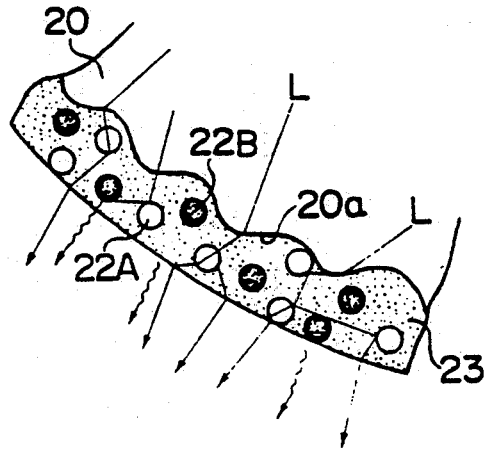
FIG. 8 is a sectional view showing a main part of a probe which is further provided with concaves and convexs.

If a scattered infrared ray generating layer 23 containing both the infrared ray converting powder 22A and the laser light scattering powders 22A is formed as shown in FIGS. 7 and 8, the abilities of scattering laser lights and of emitting infrared rays or infrared emission rate are of course increased. From both drawings, the condition of scattering of the laser light and the condition of the emitting of the infrared rays which is conveniently represented by waved arrows are readily understood.

It is preferable to form a recess 21A having a contour which strictly or substantially corresponds to the outer surface of a member to be contact, for example, the solder 3. The above-mentioned scattered infrared ray generating layer 23 may be formed on the recess 21A.

Figure 5:
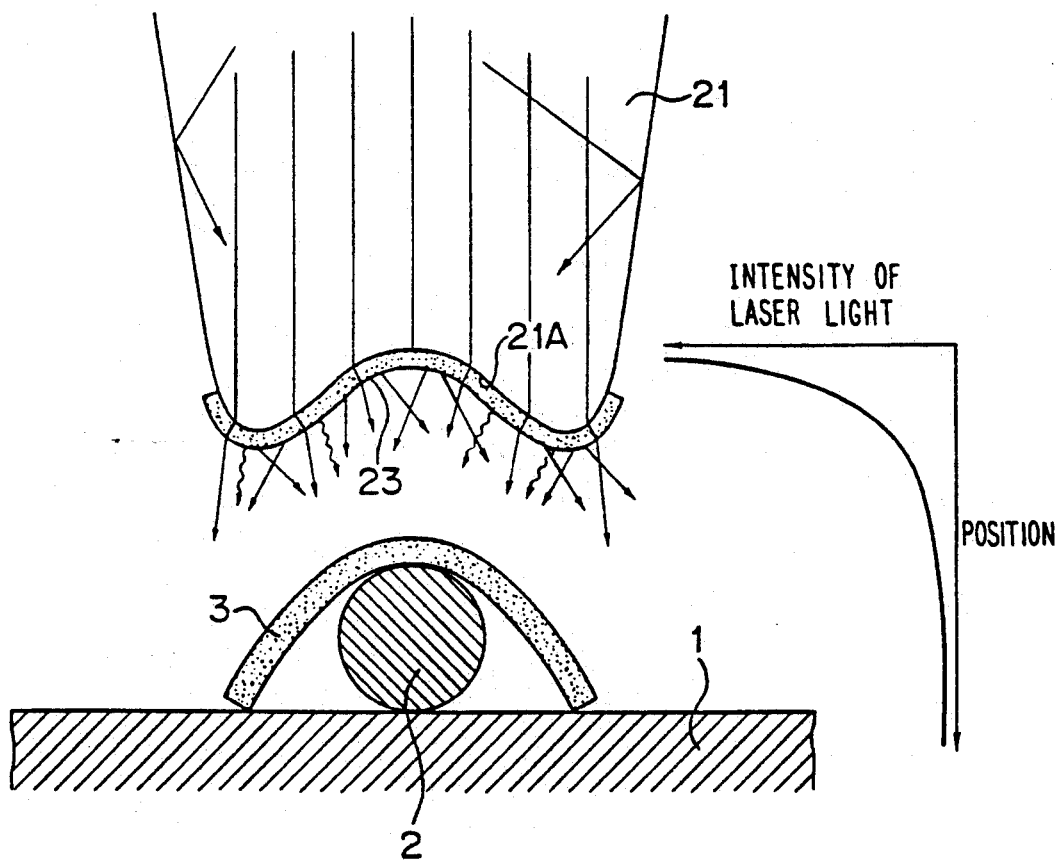
FIG. 5 is an explanatory view showing a case in which a probe having a recess is used.

If it is desired to prevent a spot of the laser lights from being diverged and not to emit the laser lights from the other part of the probe, a laser light reflective film of a material such as gold or aluminium may be coated on the surface of the probe except the scattered infrared ray generating layer 23 as shown in FIG. 5.

If the contact probe is used in accordance with the present invention, the front end of the probe can not only be formed into a shape corresponding to the formed solder as shown in FIG. 5, but can also be formed into various shapes. Thus the probe of the present invention has versatility. The relation between the position along the central cross-sectional line of the probe 21 and the intensity (power density) of laser lights is shown in FIG. 5. It will be understood from this graph that it is effective to form the front end of the probe with a recess depending upon the shape of the solder for efficiently radiating laser lights at a low power.

For example, a probe 21 having a recess 21A corresponding to the external shape of a conductor 2A is provided and formed solder 3A are disposed on both sides of the conductor 2A where the conductor 2A is soldered to a base material. While the conductor 2A is prevented from moving by the probe 21 which contacts with the conductor 2A as shown in FIGS. 9, soldering can be achieved by melting the formed solder 3A.

Soldering of the abutted portions of the conductors 2A can be achieved by pinching them between the probes 21 each having a recess 21A as shown in FIGS. 10 and 11. In this case, a solder may be preliminarily provided in the abutted portions. Alternatively, the probe 21 is formed with a solder supply hole 24 as shown in FIG. 11. After or while semi-molten or particulate solder is supplied through the hole 24, soldering can be performed.

Figure 13:
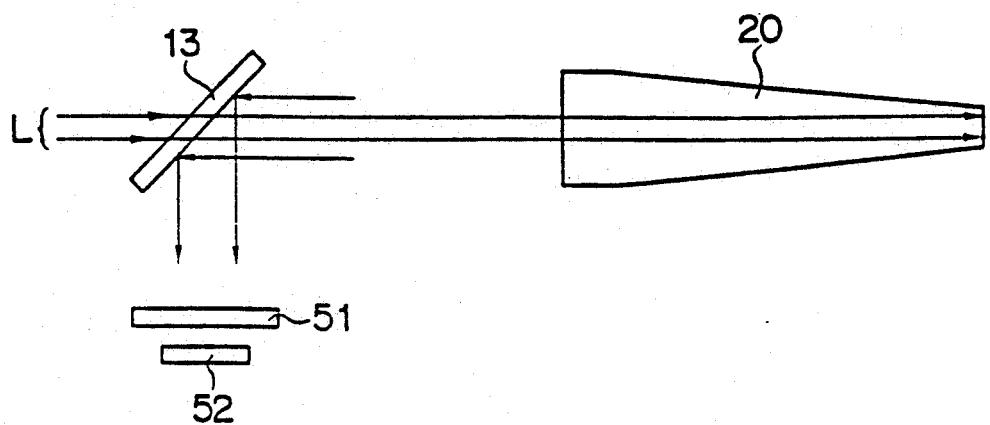
FIG. 13 is a schematic view showing an example in which returning of the laser lights is utilized.
Figure 14:
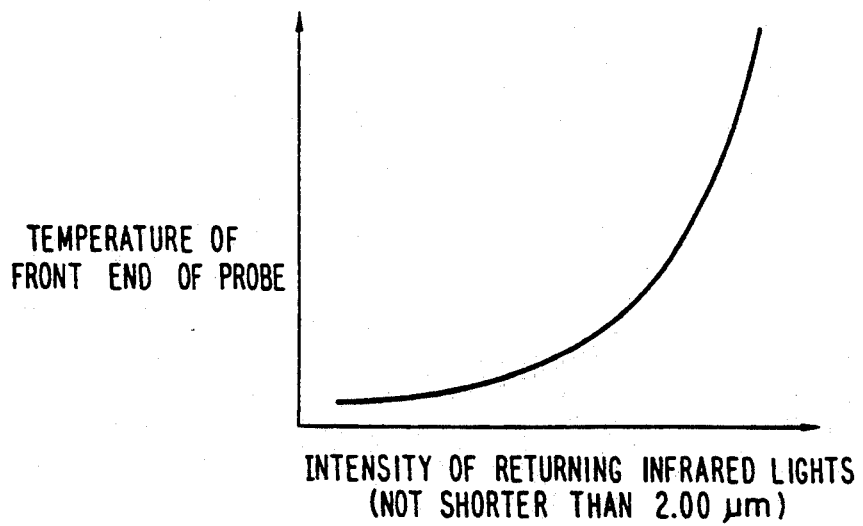
FIG. 14 is a graph showing the characteristics of the returned lights.

Soldering can be controlled by using the probe 20. In case where laser lights L, preferably infrared laser lights having a wave length not shorter than 0.7 μm, for example, YAG laser lights (wave length 1.06 μm) are transmitted through a half mirror 13 and are incident upon the probe 20 and then emitted from the front end thereof, as shown in FIG. 13, mainly lights which were reflected on the front end will return from the rear end of the probe 20 to the incidence side. The returned lights are passed through a cut filter 51 for eliminating a component having a wave length of 1.06 μm. The intensity of a component having a wave length of 2.00 μm is detected by an optical sensor 52 which is made of lead sulfide and the like. As shown in FIG. 14, the temperature of the front end of the probe can be detected from the relation between the intensity of the returned light and the temperature of the front end of the probe. As a result of this, soldering can be controlled based upon the measured temperature.

Figure 15:
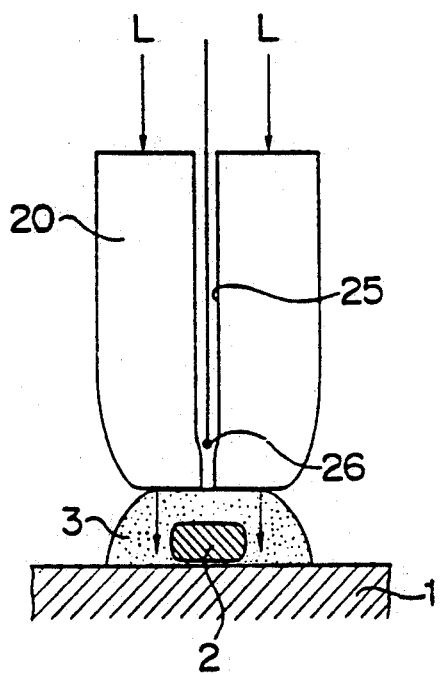
FIG. 15 is a schematic view showing another example of detecting temperature.

As shown in FIG. 15, the probe 20 is formed with a throughhole 25 in a proper position, for example in the center of the probe 20. Sensor 26 such as a thermocouple is inserted into the through-hole 25 for directly detecting the temperature of the solder 3. In this case, the solder will not enter into the through-hole 25 by its surface tension so long as the front end of the throughhole 25 is small in diameter.

Figure 12:
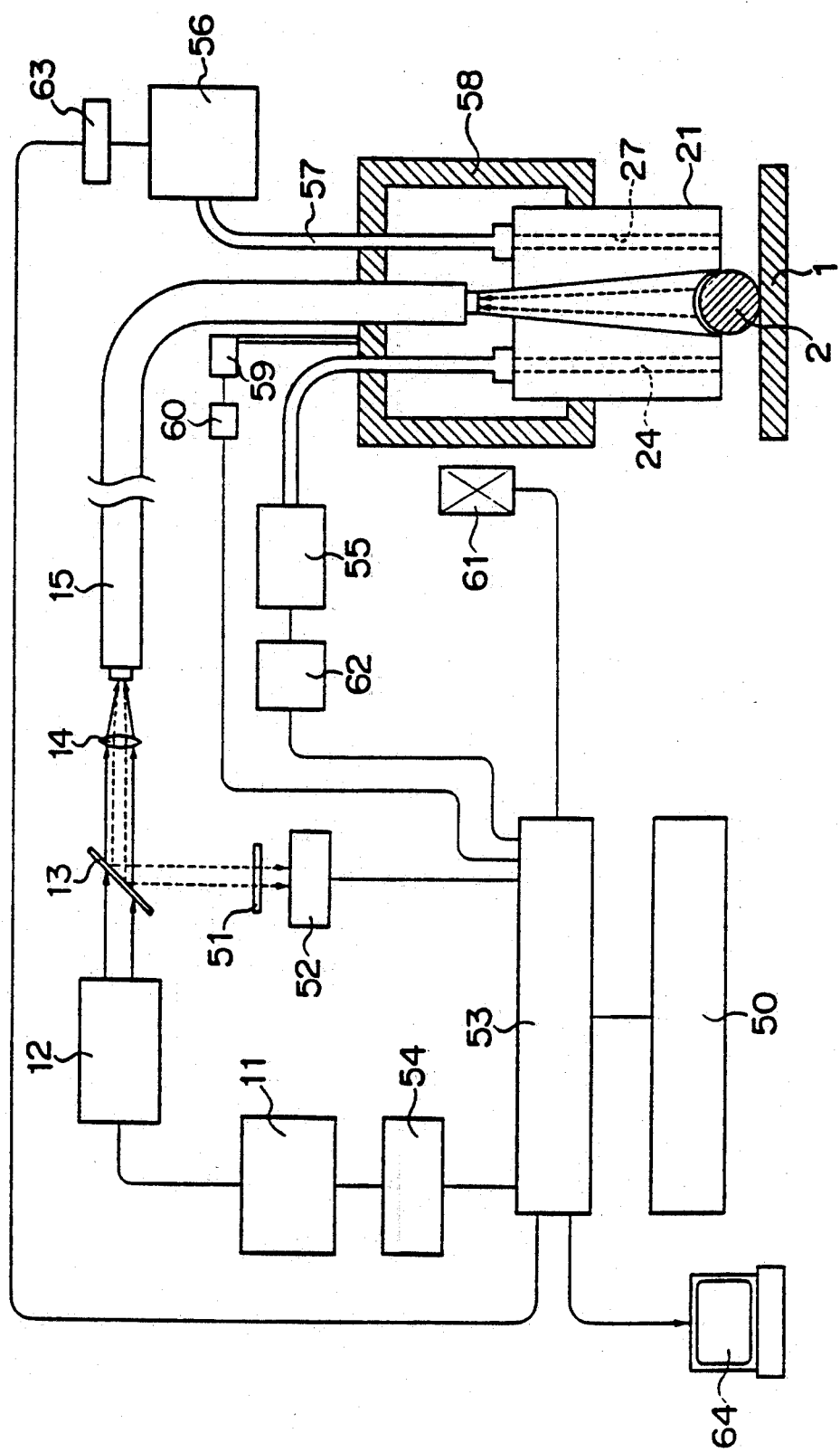
FIG. 12 is a schematic view showing a complete soldering system.

FIG. 12 shows a complete soldering system according to a preferred embodiment. A laser light generating power source 11 is driven via an interface 53 and a power source controller 54 by an operational control 50. Excited laser lights from a laser light generator 12 are incident upon the rear end of an optical fiber 15 through a temperature detecting half mirror 13 and a condensing lens 14 and are emitted from the front end of the optical fiber 15. The above-mentioned contact probe, for example, a probe 21 is disposed in front of the front end of the optical fiber 15. Laser lights are incident upon the rear end of the contact probe 21 and are emitted from the front end of the probe 21 toward a solder 3 or a member 2 to be bonded.

On the other hand, the solder is supplied to a solder supply hole 24 formed in the probe 21 from a solder reservoir 55. Flux is also supplied through the supply hole 24 from the solder reservoir 55 or another reservoir as well as the solder. Control of melting and cooling of the solder is often preferable to properly perform soldering. Accordingly, the probe 21 is formed with a coolant supply passage 27. For example, a flow of cooling air from a cooling air generator 56 can be supplied to the front end portion of the probe 21 through a supply pipe 57 and the supply passage 27.

If this system is applied to a production line, the probe 21 is preferably held on a holding head 58 so that it is automatically elevated or lowered. At this end, positioning means 59 for elevating or lowering the holding head 58 and for desiredly moving the head 58 in a horizontal direction is disposed. The positioning means 59 is driven by a controller 60 in response to a signal from an operational control 50. A contact type or optical non-contact type position detector 61 is provided to detect the position of the holding head, i.e. the probe 21. The positioning means 59 is driven in response to a position signal from the detector 61 to perform positioning of the holding head 58 in vertical and horizontal directions. Signals representative of converging or supplying of a base material 1, a member to be bonded 2 and a solder 3 as well as the position signal of the holding head 58 are also accepted by the operational control 50 for the positioning.

Reference numerals 62, 63 and 64 denote a solder supply controller, a cooling air supply controller and display means such as a CRT display, respectively.

In lieu of the cooling air, another coolant such as water, or reducing atmosphere gas such as nitrogen or inert gas such as argon can be supplied through the supply passage 27. In the latter case, it is effective to prevent the bonding portion from being oxidized.

A plurality of probes may be mounted on one holding head so that the probes can be simultaneously moved. In this case, means for moving individual probes may be provided together with means for simultaneously moving the probes.

Figure 16:
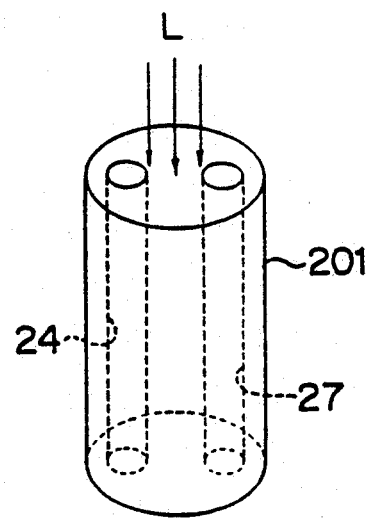
FIGS. 16 to 19 are perspective views showing examples of probes.
Figure 19:
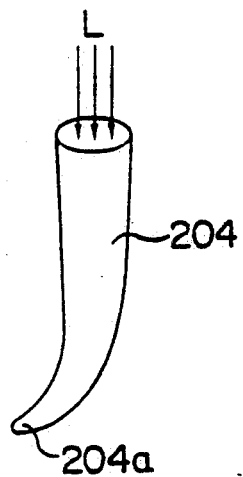
Figure 18:
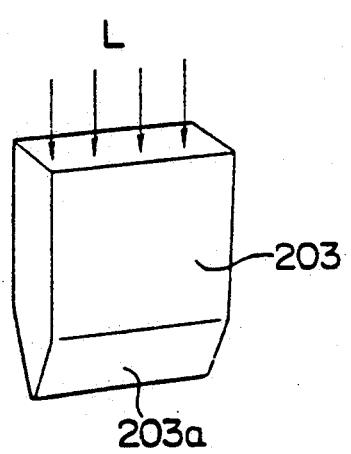
Figure 17:
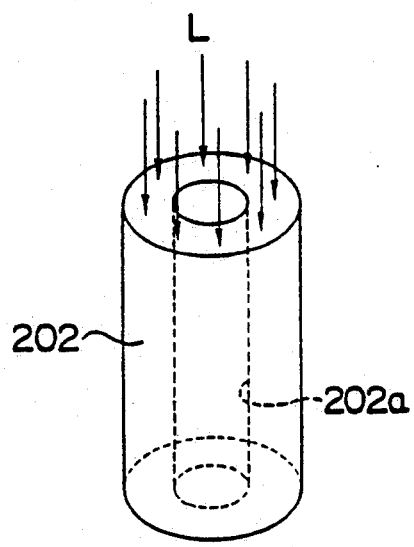

The shape of the probe in accordance with the present invention is not limited. The probe may be, for example, a cylindrical probe 201 having a flat front end as shown in FIG. 16, a cylindrical probe 202 having a through-hole 202a which is circular in section as shown in FIG. 17, a probe 203 having a rectangular main body and a tapered front end 203a as shown in FIG. 18, or a probe 204 having a conical main body and a flexible portion 204a at the front end of the main body as shown in FIG. 19. These various probes may be formed at the front end thereof with a flat end, the above mentioned recess, a circular arc portion, or other desired shapes according to the need. The through-hole 202a may be used as a passage through which solder or a cooling medium is supplied or a hole into which temperature detecting means is inserted.

Figure 20:
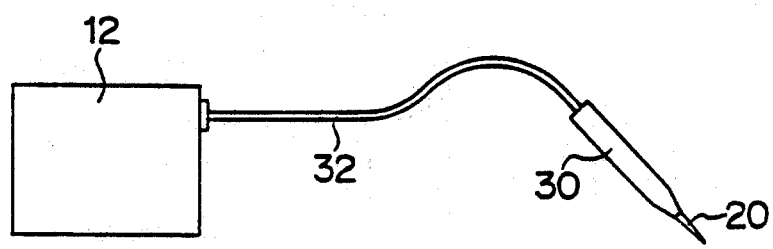
FIG. 20 is a schematic view showing an example in which a semiconductor laser is used.
Figure 21:
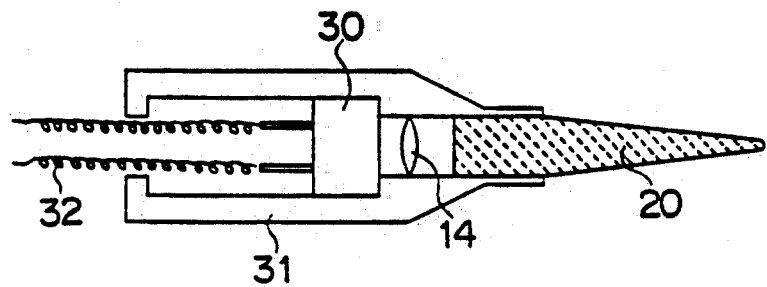
FIG. 21 showing a cross-sectional view showing a hand piece.

In the above mentioned embodiment, the probe is optically coupled with the laser light generator 12 via the optical fiber 15 so that the laser lights from the generator 12 are directed into the probe. Alternatively, laser lights may be generated by driving a diode laser 30 by the laser light generating power source 11 and may be directly incident upon the probe 20 merely through a condenser lens 14 as shown in FIGS. 20 and 21. Small size diode lasers are commercially available for use the diode laser 30. Accordingly, a very economical and compact probe assembly can be provided by receiving the compact diode laser in a holder 31 and holding the condenser lens 14 and the probe 20 therein 32 denotes a power supply conductor.

Figure 22:
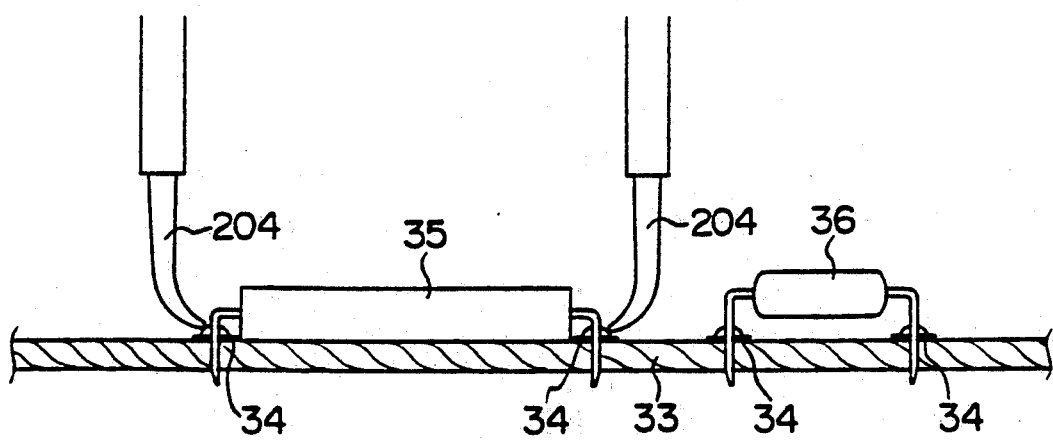
FIG. 22 is a schematic view showing the state of soldering of electronic components to a printed circuit board.
Figure 26:
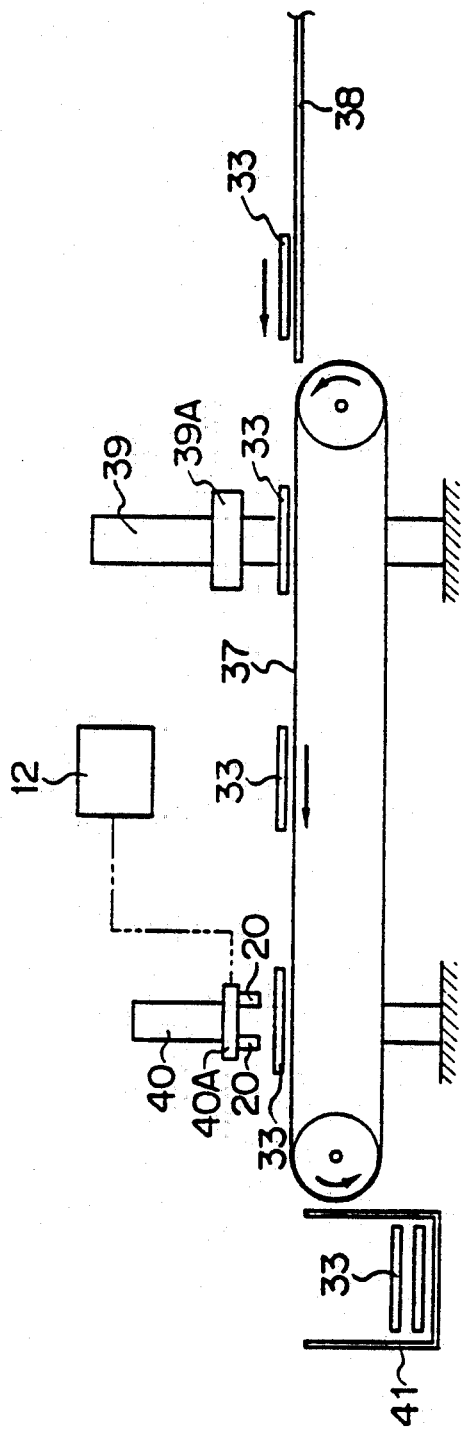
FIG. 26 is a schematic view showing a continuous soldering line.

FIG. 22 shows a manner of soldering the terminals of electronic parts such as IC chips 35 and a capacitor 36 to wires 34 which are preliminarily formed on a circuit board 33.

FIGS. 23 to 25 show different examples of ways of soldering IC chips 35 to base material by the reflow process. FIGS. 23A, 24A and 25A each shows a step of supplying solder, FIGS. 23B, 24B and 25B each shows a step of setting the IC chips 35, and FIGS. 23C, 24C and 25C, each shows a step of soldering by irradiation of laser lights. In FIGS. 23A to 23C, a solder layer 3B is preliminarily formed on the surface of the base material 1 by plating. In FIGS. 24A to 24C, formed solder 3C is disposed on the base material. In FIGS. 24A to 24C, a solder paste 3D is used. It is apparent from these examples that the member to be bonded may be directly irradiated with laser lights.

In case of continuous soldering, for example, circuit boards 33 are intermittently supplied to a conveying table 37 from a supply table 38 and then parts to be soldered are mounted upon the boards by a parts supply robot 39 which is disposed upstream of the conveying table 37 and semi-products on which parts have been mounted are supplied on the conveying table 37 and thereafter the parts are soldered to the boards by a soldering robot 40 which is disposed downstream. The finished products may be temporarily stored in a stock yard 41 in a successive manner. In this case, a head 39A of the parts supply robot 39 and a head 40A of the soldering robot 40 are freely movable along X and Y axes on a horizontal plane as well as in a vertical direction.

In the present invention, YAG laser light, holmium YAG laser light, erbium YAG laser light, diode laser light and $CO_2$ laser light may be properly selected depending upon the purpose as mentioned above.

The solder may include Sn-Pb based solder, Sn based solder, Pb based solder, Au based solder, In based solder and Al based solder. An appropriate flux may be used for soldering.

In case of where the emitted laser lights are transmitted through an optical fiber, the same effect can be obtained by contacting the optical fiber with the solder or a member to be bonded without using the above-mentioned probe. In this case, the optical fiber per se is used as a probe. Such an optical fiber probe may be formed with a recess at the front end thereof, and the above-mentioned scattering means or infrared converting means may be provided. The laser lights may be emitted from the side of the optical fiber by cutting away the clad of the front end of the optical fiber to expose the core of the fiber. The optical fiber may be made integral with a separate probe by embedding the optical fiber therein.

Industrial Applicability

In accordance with the present invention, sufficient soldering can be achieved at a low power and only a spot of an object to be heated can be positively heated as mentioned above.

What is claimed is:

1. A method of soldering a member to be bonded to a base material by irradiating the member to be bonded with laser light, comprising:
    directing said laser light so that it is incident upon a laser light transmitting probe;
    emitting the laser light from a front end of the probe and substantially contacting said front end of the probe with a solder or the member to be bonded, where the probe is formed with a layer having laser light scattering means at the front end of the probe in the contact position.

2. A method of soldering a member to be bonded to a base material by irradiating the member to be bonded with laser light, comprising:
    directing said laser light so that it is incident upon a laser light transmitting probe;
    emitting the laser light from a front end of the probe and substantially contacting said front end of the probe with a solder or the member to be bonded, wherein the probe is formed with means for converting some of the laser light into infrared rays which are easily absorbed by a material forming the object to be irradiated at the front end of the probe in the contact position.

3. A method of soldering a member to be bonded to a base material by irradiating the member to be bonded with laser light, comprising:
    directing said laser light so that it is incident upon a laser light transmitting probe;
    emitting the laser light from a front end of the probe and substantially contacting said front end of the probe with a solder or the member to be bonded, wherein the probe is formed with a layer which contains therein laser light scattering particles and infrared ray converting particles at the front end of the probe in the contact position.

4. A method of soldering a member to be bonded to a base material by irradiating the member to be bonded with laser light, comprising:
directing said laser light so that they are incident upon a laser light transmitting probe;
emitting the laser light from a front end of the probe and substantially contacting said front end of the probe with a solder or the member to be bonded, wherein the quantity of the laser light which returns from the incident surface of the probe is detected and the quantity of incident laser light is controlled as an index of temperature at the irradiation position.

5. A method of soldering a member to be bonded to a base material by irradiating the member to be bonded with laser light, comprising:
directing said laser light so that it is incident upon a laser light transmitting probe;
emitting the laser light from a front end of the probe and substantially contacting said front end of the probe with a solder or the member to be bonded, wherein a temperature probe is disposed in the probe so that it extends through the probe and contacts with or is close to the solder and the energy of the emitted laser lights is controlled based upon a temperature signal from the temperature probe.

6. A method of soldering a member to be bonded to a base material by irradiating the member to be bonded with laser light, comprising:
directing said laser light so that they are incident upon a laser light transmitting probe;
emitting the laser light from a front end of the probe and substantially contacting said front end of the probe with a solder or the member to be bonded, wherein a plurality of probes are mounted on a soldering head and laser light is emitted from each of the probes.

7. The method according to claim 2, wherein:
said means for converting some of the emitted laser light into infrared rays includes in powdered form a material selected from the group consisting of carbon, graphite, iron oxide and manganese oxide.

8. The method according to claim 3, wherein:
said infrared ray converting particles comprise in powdered form a material selected from the group consisting of carbon, graphite, iron oxide and manganese oxide.

9. The method according to claim 4, wherein:
the step of detecting returning laser light comprises the step of passing the returned laser light through a cut filter for eliminating a component having a selected wavelength.

10. The method according to claim 9, wherein: the selected wavelength is 1.06 μm.

11. The method according to claim 1, comprising the further step of:
directing a coolant flow toward said member while emitting said laser light from said probe, said coolant flow comprising a material selected from a group consisting of water, nitrogen and argon.

12. The method according to claim 2, comprising the further step of:
directing a coolant flow toward said member while emitting said laser light from said probe, said coolant flow comprising a material selected from a group consisting of water, nitrogen and argon.

13. The method according to claim 3, comprising the further step of:
directing a coolant flow toward said member while emitting said laser light from said probe, said coolant flow comprising a material selected from a group consisting of water, nitrogen and argon.

14. The method according to claim 4, comprising the further step of:
directing a coolant flow toward said member while emitting said laser light from said probe, said coolant flow comprising a coolant material selected from a group consisting of water, nitrogen and argon.

15. The method according to claim 5, comprising the further step of:
directing a coolant flow toward said member while emitting said laser light from said probe, said coolant flow comprising a coolant material selected from a group consisting of water, nitrogen and argon.

16. The method according to claim 6, comprising the further step of:
directing a coolant flow toward said member while emitting said laser light from said probe, said coolant flow comprising a coolant material selected from a group consisting of water, nitrogen and argon.

17. The method according to claim 1, comprising the further step of:
providing a reflective film on a portion of the surface of the probe.

18. The method according to claim 3, comprising the further step of:
providing a reflective film on a surface of the probe not covered by the layer containing laser light scattering particles.

19. The method according to claim 17, wherein:
said reflective film comprises one of gold and aluminum.

20. The method according to claim 18, wherein:
said reflective film comprises one of gold and aluminum.

* * * * *